(12) United States Patent
Nakao et al.

(10) Patent No.: US 11,169,059 B2
(45) Date of Patent: Nov. 9, 2021

(54) CHEMICAL SUBSTANCE CONCENTRATOR AND CHEMICAL SUBSTANCE DETECTION DEVICE

(71) Applicant: Panasonic Corporation, Osaka (JP)

(72) Inventors: Atsuo Nakao, Nara (JP); Yosuke Hanai, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 295 days.

(21) Appl. No.: 16/321,217

(22) PCT Filed: Sep. 28, 2017

(86) PCT No.: PCT/JP2017/035095
§ 371 (c)(1),
(2) Date: Jan. 28, 2019

(87) PCT Pub. No.: WO2018/079174
PCT Pub. Date: May 3, 2018

(65) Prior Publication Data
US 2019/0170619 A1 Jun. 6, 2019

(30) Foreign Application Priority Data
Oct. 31, 2016 (JP) .............................. JP2016-212432

(51) Int. Cl.
*G01N 1/40* (2006.01)
*B01D 53/04* (2006.01)
(Continued)

(52) U.S. Cl.
CPC ......... *G01N 1/405* (2013.01); *B01D 53/0438* (2013.01); *B01D 53/0446* (2013.01);
(Continued)

(58) Field of Classification Search
CPC ........ G01N 1/405; G01N 30/00; G01N 30/06; B01D 53/0438; B01D 53/0446;
(Continued)

(56) References Cited

U.S. PATENT DOCUMENTS

2008/0093226 A1* 4/2008 Briman ................ G01N 27/127
205/775
2008/0204048 A1* 8/2008 Stasiak ............. G01N 27/3278
324/679
(Continued)

FOREIGN PATENT DOCUMENTS

JP        9-029045       2/1997
JP        2001-041916    2/2001
(Continued)

OTHER PUBLICATIONS

International Search Report of PCT application No. PCT/JP2017/035095 dated Dec. 26, 2017.

*Primary Examiner* — Samuel P Siefke
*Assistant Examiner* — Oyeleye Alexander Alabi
(74) *Attorney, Agent, or Firm* — McDermott Will and Emery LLP

(57) ABSTRACT

A chemical substance concentrator is configured to concentrate a chemical substance contained in a gaseous sample. The concentrator includes a flow passage having a hollow part allowing the gaseous sample flows through the hollow part, first and second electrodes disposed on an inner wall of the flow passage, an electrode wiring connected to the first and second electrodes, a material layer disposed on the electrode wiring, and an adsorbent disposed on the material layer. The adsorbent is configured to adsorb the chemical substance and to desorb the adsorbed chemical substance. The chemical substance concentrator is capable of efficiently desorbing the adsorbed chemical substances.

18 Claims, 14 Drawing Sheets

(51) Int. Cl.
- *B01J 20/28* (2006.01)
- *B01J 20/06* (2006.01)
- *B82Y 30/00* (2011.01)
- *B81B 7/02* (2006.01)
- *G01N 30/00* (2006.01)
- *B01J 20/20* (2006.01)
- *G01N 30/06* (2006.01)

(52) U.S. Cl.
CPC ............ *B01J 20/06* (2013.01); *B01J 20/205* (2013.01); *B01J 20/28007* (2013.01); *B81B 7/02* (2013.01); *B82Y 30/00* (2013.01); *G01N 30/00* (2013.01); *B01D 2253/1124* (2013.01); *B01D 2257/304* (2013.01); *B01D 2257/306* (2013.01); *B01D 2257/702* (2013.01); *B01D 2257/708* (2013.01); *B01D 2258/06* (2013.01); *B01D 2259/40096* (2013.01); *B01J 2220/66* (2013.01); *G01N 30/06* (2013.01)

(58) Field of Classification Search
CPC ...... B01D 2253/1124; B01D 2257/304; B01D 2257/306; B01D 2257/702; B01D 2257/708; B01D 2258/06; B01D 2259/40096; B01J 20/06; B01J 20/205; B01J 20/28007; B01J 2220/66; B81B 7/02; B82Y 30/00

See application file for complete search history.

(56) References Cited

U.S. PATENT DOCUMENTS

| | | | |
|---|---|---|---|
| 2010/0112546 A1* | 5/2010 | Lieber | A61B 5/418 435/5 |
| 2012/0223226 A1* | 9/2012 | Rafferty | G01N 1/405 250/288 |
| 2017/0212069 A1 | 7/2017 | Nakao et al. | |

FOREIGN PATENT DOCUMENTS

| | | |
|---|---|---|
| JP | 2001-296218 | 10/2001 |
| JP | 2002-518668 | 6/2002 |
| JP | 2013-010090 | 1/2013 |
| JP | 2014-504740 | 2/2014 |
| JP | 2014-228485 | 12/2014 |
| JP | 2014228485 A * | 12/2014 |
| WO | 1999/066304 | 12/1999 |
| WO | 2016/103561 | 6/2016 |

* cited by examiner

CHEMICAL SUBSTANCE CONCENTRATOR AND CHEMICAL SUBSTANCE DETECTION DEVICE

CROSS-REFERENCE TO RELATED APPLICATIONS

This application is a U.S. national stage application of the PCT international application No. PCT/JP2017/035095 filed on Sep. 28, 2017, which claims the benefit of foreign priority of Japanese patent application No. 2016-212432 filed on Oct. 31, 2016, the contents all of which are incorporated herein by reference.

TECHNICAL FIELD

The present disclosure relates to a chemical substance concentrator configured to concentrate chemical substance contained in gas, and to a chemical substance detection device including the concentrator.

BACKGROUND ART

Technologies of analyzing chemical substances contained in a gas are disclosed in, for example, PTL 1 and PTL 2. PTL 1 discloses an apparatus for analyzing organic substance contained in a gas inside an electric power device. The apparatus allows the gas pass through a pipe provided with a trap while the temperature of the trap is held constant such that the organic substance contained in the gas is adsorbed on an adsorbent. Then, the trap is heated to cause the adsorbed organic substance to be introduced into a detection device. PTL 2 discloses a detection device for detecting a fine amount of analyte. The detection device includes an adsorbent material capable of adsorbing the analyte and desorbing concentrated analyte.

CITATION LIST

Patent Literature

PTL 1: Japanese Patent Laid-Open Publication No. 2001-296218
PTL 2: Japanese Patent Laid-Open Publication No. 2002-518668

SUMMARY

A chemical substance concentrator is configured to concentrate a chemical substance contained in a gaseous sample. The concentrator includes a flow passage having a hollow part allowing the gaseous sample flows through the hollow part, first and second electrodes disposed on an inner wall of the flow passage, an electrode wiring connected to the first and second electrodes, a material layer disposed on the electrode wiring, and an adsorbent disposed on the material layer. The adsorbent is configured to adsorb the chemical substance and to desorb the adsorbed chemical substance.

The chemical substance concentrator is capable of efficiently desorbing the adsorbed chemical substances.

DETAIL DESCRIPTION OF PREFERRED EMBODIMENT

Hereinafter, detailed descriptions will be made regarding chemical substance concentrators and a chemical substance detection device, according to exemplary embodiments, with reference to the accompanying drawings. It is noted, however, that each of the exemplary embodiments described below shows a preferable and specific example. Numerical values, shapes, materials, constituent elements, arrangements and connections of the constituent elements, etc. shown in the following exemplary embodiments are mere examples, and therefore are not intended to limit the present disclosure. Therefore, of the constituent elements in the following exemplary embodiments, constituent elements not recited in any one of the independent claims which define the most generic concept of the present disclosure are described as optional constituent elements.

Throughout the drawings, the figures are schematic ones and their illustrations are not necessarily strictly accurate. Throughout the figures, substantially identical elements are designated by the same numerals and symbols, and their duplicate explanations are omitted or simplified.

Figure 1:
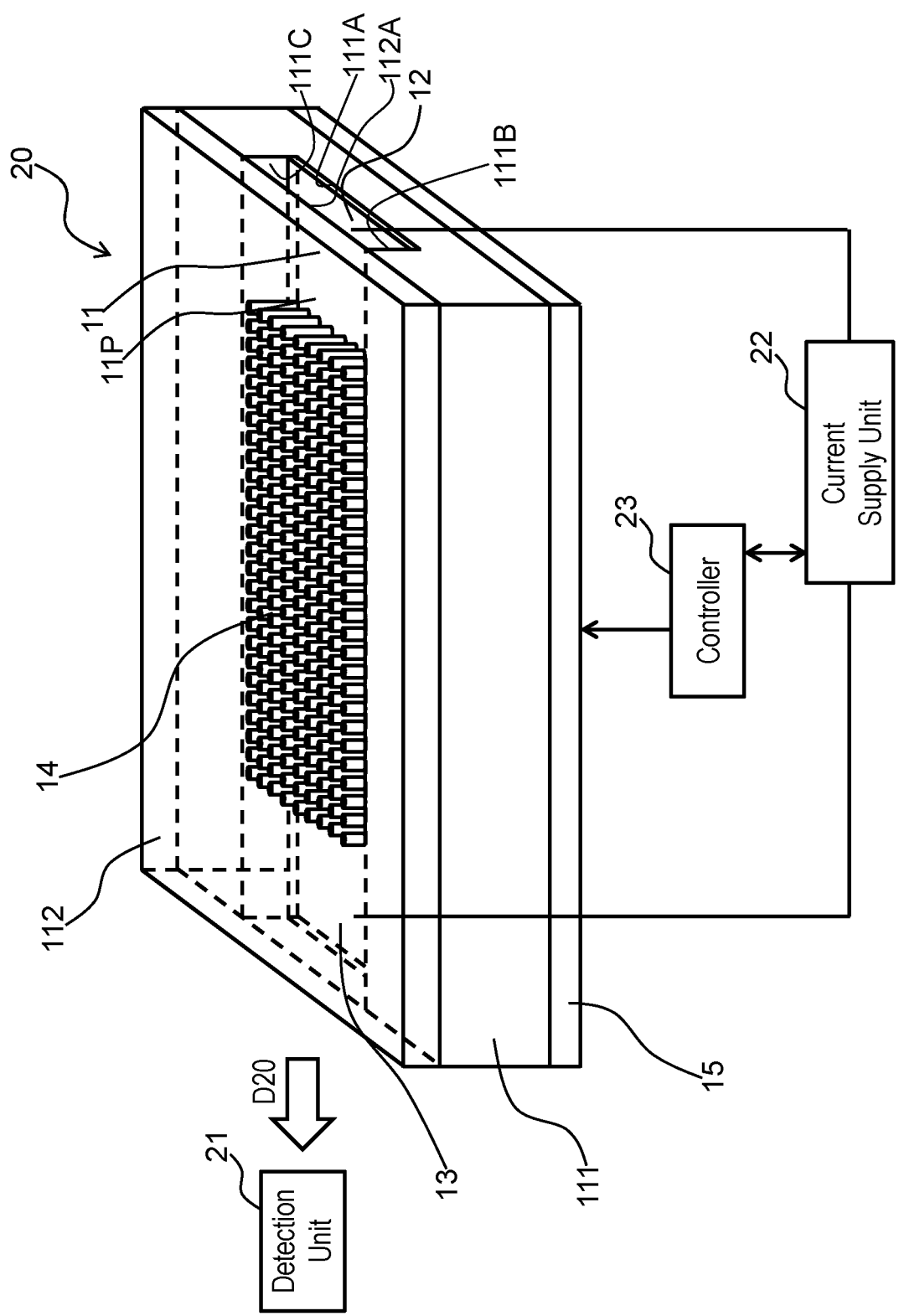
FIG. 1 is a perspective view of a chemical substance concentrator according to an exemplary embodiment.
Figure 2:
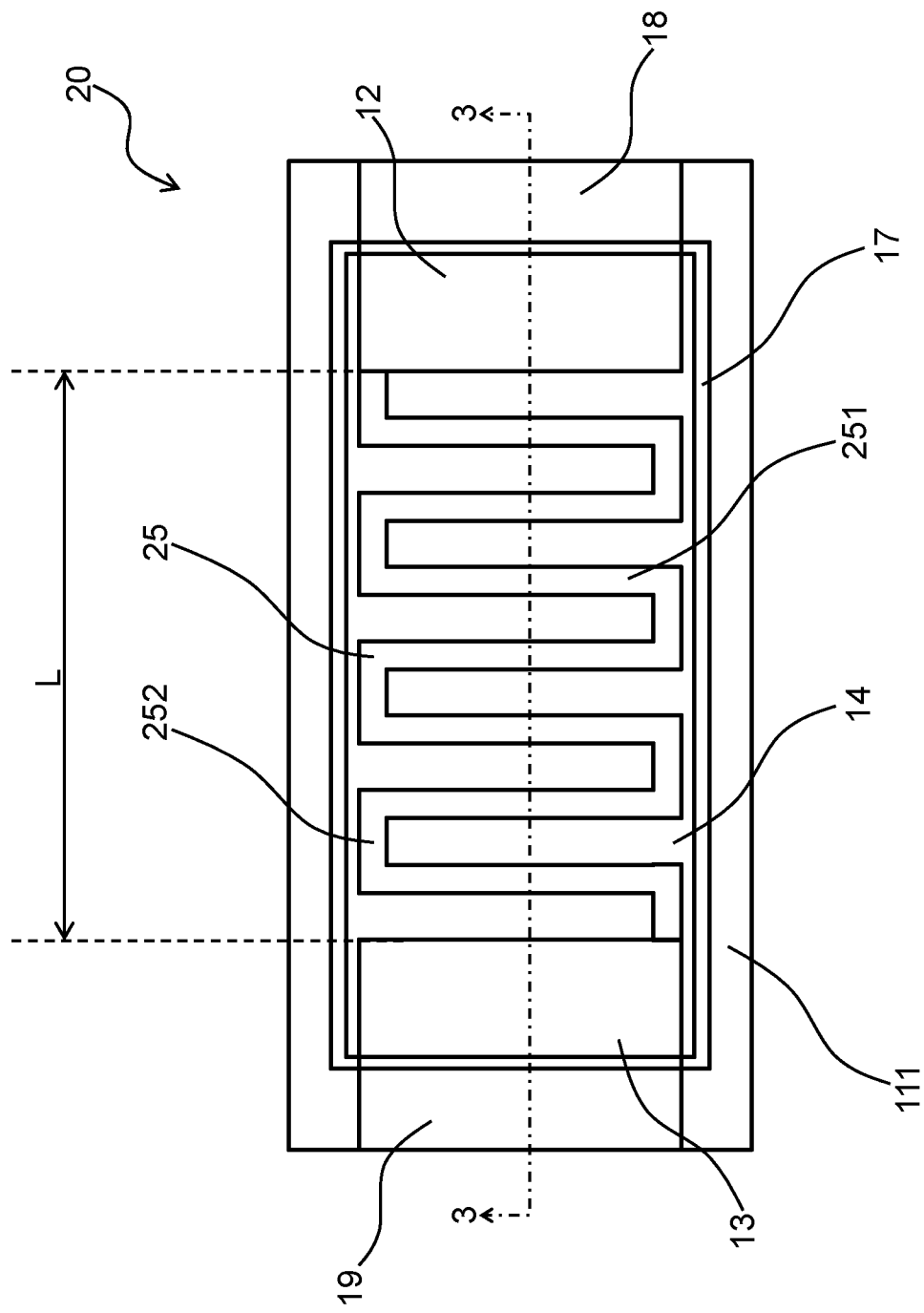
FIG. 2 is a top perspective view of the chemical substance concentrator according to the embodiment.
Figure 3:
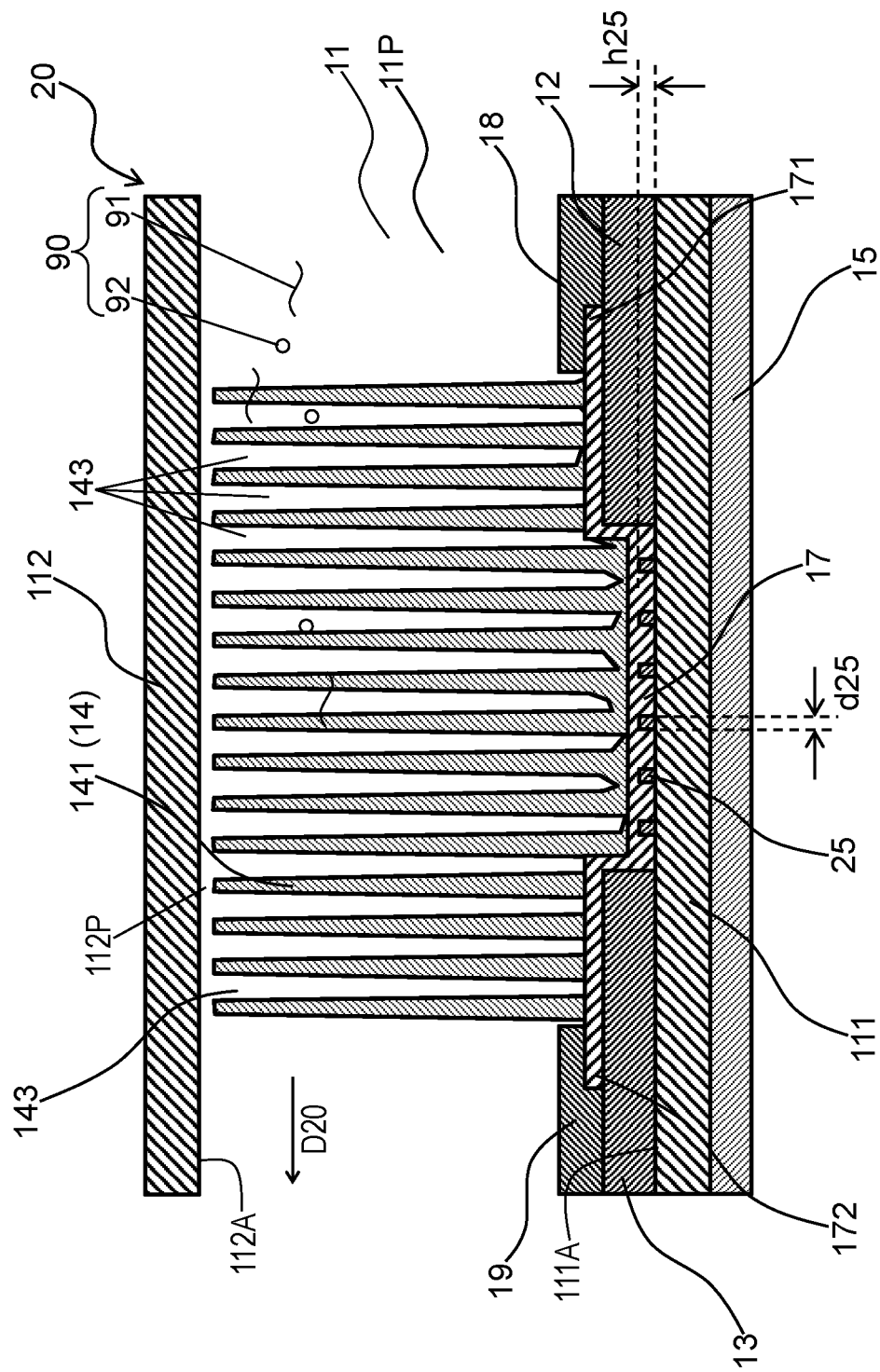
FIG. 3 is a cross-sectional view of the chemical substance concentrator, along line 3-3 shown in FIG. 2.

FIG. 1 is a schematic perspective view of chemical substance concentrator 20 according to an exemplary embodiment. FIG. 2 is a schematic top-perspective view of chemical substance concentrator 20. FIG. 3 is a cross-sectional view of chemical substance concentrator 20 along line 3-3 shown in FIG. 2.

Chemical substance concentrator 20 concentrates is configured to chemical substance 92 contained in gaseous sample 90 flowing into the concentrator 20. Chemical substance 92 concentrated by chemical substance concentrator 20 is detected by, for example, detection unit 21 disposed downstream of chemical substance concentrator 20. Gaseous sample 90 contains gaseous medium 91 and chemical substances 92 floating in gaseous medium 91.

Gaseous sample 90 may be, e.g. exhaled air of humans and animals, and exhaust from cars and factories. Chemical substance 92 to be concentrated may by volatile organic compound, such as, ketone, amine, alcohol, aromatic hydrocarbon, aldehyde, ester, organic acid, hydrogen sulfide, methyl mercaptan, or disulfide.

Chemical substance concentrator 20 includes flow passage 11 including hollow part 11P through which gaseous sample 90 containing chemical substances 92 flows, electrode 12 disposed in hollow part 11P of flow passage 11, electrode 13 disposed in hollow part 11P and located away from electrode 12, electrode wiring 25 connected to electrodes 12 and 13, material layer 17 disposed on electrode wiring 25, and adsorbent 14 disposed on material layer 17. Flow passage 11 has inner walls 111A, 111B, 111C, and 112A which face hollow part 11P. Inner wall 111B faces inner wall 111C across hollow part 11P. Inner wall 112A faces inner wall 111A across hollow part 11P. Inner wall 111C is connected to inner walls 111A and 111B. Inner wall 112A is connected to inner walls 111A and 111B. Electrodes 12 and 13 are disposed on inner wall 111A of flow passage 11. Material layer 17 is disposed on electrodes 12 and 13 and electrode wiring 25. Electrode wiring 25 is disposed on inner wall 111A and between electrodes 12 and 13. The length of electrode wiring 25 is larger than distance L between electrodes 12 and 13. Electrode wiring 25 includes straight sections 251 and turn-back sections 252 which are connected to straight sections 251.

Chemical substance concentrator 20 may further includes electrodes 18 and 19 and cooling unit 15 that cools adsorbent 14. Apart of material layer 17 is sandwiched between electrodes 12 and 18 while another part of material layer 17 is sandwiched between electrodes 13 and 19.

Flow passage 11 is provided in lower substrate 111 for example, such that the flow passage is constituted by a groove provided in lower substrate 111 and upper substrate 112 covering the groove. Lower substrate 111 and upper substrate 112 are made of material, such as resin or metal. Inner wall 111A facing flow passage 11 is a bottom surface of the groove provided in lower substrate 111. Inner wall 111B is a side wall on one side of the groove. Inner wall 111C is a side wall on the other side of the groove. Inner wall 112A is a lower surface of upper substrate 112 covering an upper end of the groove. Flow passage 11 (hollow part 11P) has a rectangular column shape surrounded by inner walls 111A, 111B, 111C, and 112A disposed along an extension direction in which flow passage 11 extends. The flow passage may have more inner walls to have a polygonal column shape which has more than four faces. Flow passage 11 (hollow part 11P) may have a circular column shape having a circular cross section and extending along the extension direction. Flow passage 11 having the circular column shape has a curved inner wall surface.

Electrode 12 is disposed on inner wall 111A inside flow passage 11. Electrode 12 is made of electrically-conductive material, such as gold, copper, platinum, nickel-chromium alloy, or carbon.

Electrode 13 is disposed on inner wall 111A inside flow passage 11. Electrode 13 is made of electrically-conductive material, such as gold, copper, platinum, nickel-chromium alloy, or carbon. Electrodes 12 and 13 may be made of the same material.

Electrodes 12 and 13 are disposed on the same surface, inner wall 111A in flow passage 11. Electrode 13 is located away from electrode 12 so as not to directly contact electrode 12. Electrodes 12 and 13 are arranged in direction D20 in which gaseous sample 90 flows.

Electrodes 12 and 13 may be arranged in a direction perpendicular to direction D20 in which gaseous sample 90 flows.

Electrode wiring 25 is disposed on inner wall 111A and between electrodes 12 and 13. Electrode wiring 25 is connected to electrodes 12 and 13.

Upon energized by an electric current flowing through electrode wiring 25 via electrodes 12 and 13, electrode wiring 25 generates heat, i.e. Joule heat. Adsorbent 14 is heated by the Joule heat generated by electrode wiring 25. The heat causes chemical substances 92 which have been adsorbed by adsorbent 14 to be desorbed from adsorbent 14. In accordance with the embodiment, electrode wiring 25 heats adsorbent 14 up to approximately 200° C. and causes chemical substances to be desorbed from adsorbent 14. Therefore, adsorbent 14 and material layer 17 are preferably made of material easily transmitting heat.

Electrode wiring 25 is made of electrically-conductive material, such as gold, copper, platinum, nickel-chromium alloy, or carbon. Electrode wiring 25 is preferably made of the same material as electrodes 12 and 13 from a manufacturing process point of view. Electrode wiring 25 according to the embodiment has a high resistance suitable for resistance heating. That is, upon allowing an electric current flowing through electrode wiring 25, electrode wiring 25 can convert the electrical energy to thermal energy without loss, resulting in a highly-efficient heat generation. Electrode wiring 25 more preferably has an electrical resistance not lower than 10Ω and not higher than 1 kΩ. Electrode wiring 25 having the electrical resistance not lower than 10Ω and not higher than 1 kΩ can generate heat more efficiently.

The length of electrode wiring 25 is larger than distance L between electrodes 12 and 13. That is, electrode wiring 25 is disposed such that the contact area in which electrode wiring 25 contacts material layer 17 becomes large. This configuration expands the area that can be heated by electrode wiring 25, resulting in uniform heating of adsorbent 14.

Electrode wiring 25 includes straight sections 251 and turn-back sections 252 which are connected to straight sections 251. Thickness h25 of electrode wiring 25 is, e.g. 200 nm. In a case where thickness h25 of electrode wiring 25 is smaller than 20 nm, electrode wiring 25 may break. In a case where thickness h25 of electrode wiring 25 is not smaller than 1 μm, it requires a complicated manufacturing process. For this reason, thickness h25 of the electrode wiring is preferably not smaller than 20 nm and not larger than 1 μm.

Electrode wiring 25 has a meandrous shape. Width d25 of electrode wiring 25 is, e.g. 50 μm. The length of electrode wiring 25 is not smaller than 1.4 times distance L. For example, in a case where distance L is 10 mm, the length of electrode wiring 25 is not smaller than 14 mm.

Electrode wiring 25 having a high electrical resistance can heat adsorbent 14 efficiently.

Material layer 17 is provided on electrode wiring 25 and electrodes 12 and 13. Material layer 17 contacts electrode wiring 25 and electrodes 12 and 13. Material layer 17 contacts inner wall 111A between straight sections 251 of the electrode wiring.

Material layer 17 is made of metal oxide, such as $SnO_2$, ZnO, $In_2O_3$, $In_{2-x}Sn_xO_3$ (e.g. $0.1 \leq x \leq 0.2$), NiO, CuO, $TiO_2$, or $SiO_2$. Material layer 17 may be made of material, such as carbon, silicon, or metal such as Al, Ag, Au, Pd, or Pt. Material layer 17 serves as, e.g. a seed layer for adsorbent 14. That is, adsorbent 14 is formed on material layer 17.

Electrodes 18 and 19 are provided on material layer 17.

Electrode 18 faces electrode 12 across material layer 17. That is, material layer 17 is sandwiched between electrodes 12 and 18. Electrode 18 covers a side surface and an upper surface of end portion 171 of material layer 17. Electrode 18 contacts electrode 12. This configuration prevents end portion 171 of material layer 17 from peeling off from electrode 12.

Electrode 19 faces electrode 13 across material layer 17. That is, material layer 17 is sandwiched between electrodes 13 and 19. Electrode 19 covers a side surface and an upper surface of end portion 172 of material layer 17. Electrode 19 contacts electrode 13. This configuration prevents end portion 172 of material layer 17 from peeling off from electrode 13.

Electrodes 18 and 19 thus increases reliability of chemical substance concentrator 20.

Adsorbent 14 adsorbs chemical substances 92 contained in gaseous sample 90.

Adsorbent 14 is disposed on material layer 17 that is formed on electrodes 12 and 13 and inner wall 111A. Adsorbent 14 is coupled to electrodes 12 and 13 via material layer 17.

Adsorbent 14 is an aggregate of nanowires 141 having electrical conductivity. That is, adsorbent 14 is made of a group of conductive nanowires 141. Adsorbent 14 is made of, for example, conductive metal oxide. Spaces 143 are disposed between nanowires 141. Chemical substances 92 contained in gaseous sample 90 are adsorbed on nanowires 141 during passing through spaces 143.

Nanowires 141 having electrical conductivity are made of material, for example, carbon, silicon, metal oxide, such as $SnO_2$, ZnO, $In_2O_3$, $In_{2-x}Sn_xO_3$ (e.g. $0.1 \leq x \leq 0.2$), NiO, CuO, $TiO_2$, or $SiO_2$, or metal, such as Al, Ag, Au, Pd, or Pt. The nanowires made of carbon may be, e.g. carbon nanotubes. That is, adsorbent 14 is made of material having electrical conductivity and thermal conductivity so as to efficiently transmit, to the adsorbent, the heat generated by electrode wiring 25 due the Joule effect.

Nanowire 141 may be a wire made of resin having a surface covered with a metal oxide having electrical conductivity. The conductive metal oxide covering of adsorbent 14 provides adsorbent 14 with electrical conductivity.

Adsorbent 14 is preferably made of the same material as material layer 17. Adsorbent 14 and material layer 17 made of the same material increases a bonding strength of adsorbent 14 and material layer 17, thereby preventing adsorbent 14 from peeling off from material layer 17.

The electrical resistances of adsorbent 14 and material layer 17 are preferably larger than the electrical resistance of electrode wiring 25. This configuration allows electrode wiring 25 to generate a sufficiently large amount of heat, thereby efficiently heating adsorbent 14. In a case where the electrical resistances of adsorbent 14 and material layer 17 are smaller than the electrical resistance of electrode wiring 25, a large part of the electric current flowing between electrodes 12 and 13 passes not through not electrode wiring 25 but through adsorbent 14 and material layer 17. This accordingly prevents electrode wiring 25 from generating a sufficiently large amount of heat, hence preventing adsorbent 14 from being efficiently heated.

Current supply unit 22 is connected to electrodes 12 and 13 for supplying an electric current to electrode wiring 25. Controller 23 is connected to current supply unit 22 for controlling the current flowing through electrode wiring 25.

The current flowing through electrode wiring 25 is preferably controlled by controller 23 such that the current density of the current is not smaller than 200 $kA/cm^2$. This configuration causes electrode wiring 25 to generate a large amount of heat for a short period of time, accordingly heating adsorbent 14 efficiently in the short period.

Cooling unit 15 cools adsorbent 14. Upon being cooled, adsorbent 14 efficiently adsorb chemical substances 92.

Cooling unit 15 is disposed on a surface of lower substrate 111 opposite to inner wall 111A. Cooling unit 15 is implemented by, e.g. a Peltier element. This configuration allows controller 23 connected to cooling unit 15 to control the cooling of adsorbent 14.

Cooling unit 15 may be disposed at an arbitrary location capable of cooling adsorbent 14. For example, cooling unit 15 may be disposed inside flow passage 11. Cooling unit 15 may be disposed on either electrode 12 or 13. Electrodes 12 and 13 are made of metal having high thermal conductivity, and accordingly cool adsorbent 14 efficiently. In a case where cooling unit 15 is disposed on electrode 12, an electrical insulating layer may be disposed between cooling unit 15 and electrode 12. Similarly, in a case where cooling unit 15 is disposed on electrode 13, an electrical insulating layer may be disposed between cooling unit 15 and electrode 13.

In a case where adsorbent 14 is able to sufficiently adsorb chemical substances 92, chemical substance concentrator 20 does not necessarily include cooling unit 15.

The reason why adsorbent 14 according to the embodiment includes nanowires 141 is that the nanowires provide adsorbent 14 with a large specific surface area facilitating a highly-efficient adsorption of chemical substances 92, accordingly concentrating chemical substance 92 efficiently. The heat capacity of nanowires 141 is so small that a large change in temperature can be caused by a small amount of electrical power.

Electrode wiring 25 functions as a heater. Chemical substance concentrator 20 can desorb absorbed chemical substances 92 from adsorbent 14 without an external heater with large power consumption.

The heat generated by electrode wiring 25 is directly transmitted to adsorbent 14 via material layer 17, and then is utilized to desorb chemical substances 92 having been adsorbed. That is, chemical substance concentrator 20 has a higher thermal efficiency than other devices including external heaters.

In general, in a case where an external heater is used, the heat generated by the external heater diffuses into surroundings thereof, and transmitted to adsorbent 14 less efficiently. In addition, such a low thermal efficiency requires additional power to heat adsorbent 14 sufficiently, resulting in an increase of power consumption of the device.

An external heater requires electrical power of about several tens to about several hundred milliwatts (mW). On the other hand, with micro electro mechanical systems (MEMS) technology, for example, a heater configured made of a Pt-resistance wire to desorb chemical substances requires power not smaller than several milliwatts (mW).

The conventional apparatus disclosed in PTL 1 or PTL 2 requires an external heating device, such as an external heater, to introduce, into a detection device, chemical substances which have been absorbed. The chemical substances may not be desorbed sufficiently without the external heating device.

In cases where an external heating device is used to heat an adsorbent, part of heat generated by the heating device diffuses into surroundings thereof, and is not transmitted to the adsorbent. That is, the conventional apparatus with such an external device, the heating device provides a large thermal loss preventing the adsorbent from being heated efficiently. The efficiency of heating the adsorbent adversely affect desorption of the adsorbed substances.

As described above, chemical substance concentrator 20 according to the embodiment is able to concentrate chemical substance 92 by efficiently desorbing chemical substance 92 from adsorbent 14 with low power consumption. Because of no need for using any external heater, chemical substance concentrator 20 has a small size.

A method of manufacturing chemical substance concentrator 20 will be described below.

First, a groove is formed in a Si substrate by, e.g. etching to prepare lower substrate 111. Then, electrodes 12 and 13 and electrode wiring 25 are formed on inner wall 111A that is a bottom surface of the groove which is formed in the Si substrate and which faces flow passage 11. In this case, electrode 12 is formed to be located away from electrode 13. Electrode wiring 25 is disposed between electrodes 12 and 13. Electrode wiring 25 is connected to electrodes 12 and 13. Electrode wiring 25 is formed by vapor deposition or sputtering with a resist mask having a meandrous shape prepared by photolithography. According to the embodiment, electrodes 12 and 13 and electrode wiring 25 are made of Au.

Next, a ZnO film contacting electrodes 12 and 13, inner wall 111A, and electrode wiring 25 is formed by vapor deposition or sputtering with a mask. This ZnO film constitutes material layer 17.

After that, electrodes 18 and 19 are formed at respective locations by vapor deposition or sputtering with a mask. The locations are opposing to each other about electrodes 12 and 13 and material layer 17. According to the embodiment, electrodes 18 and 19 are made of Au.

The above processes provide the structure described below at the bottom surface of the groove provided in the Si substrate. The ZnO film is formed on electrode wiring 25 having the meandrous shape, and has a part sandwiched by electrodes 12 and 13 and another part sandwiched by electrodes 18 and 19.

After that, plural nanowires 141 are formed by liquid-phase growth or gas-phase growth with the ZnO film as a seed layer. The material of nanowires 141 is ZnO, that is, the same as that of the above-described ZnO film serving as the seed layer. The nanowires 141 are formed on the ZnO film to configure an aggregate. Adsorbent 14 is, e.g. the aggregate of nanowires 141. Nanowires 141 are formed only on material layer 17 that serves as the seed layer which is not sandwiched by electrodes 12, 13, 18, and 19.

Finally, a Si substrate constituting upper substrate 112 is bonded to lower substrate 111 such that a clearance is provided between the upper substrate and adsorbent 14 that is the aggregate of nanowires 141. Flow passage 11 is formed in the groove between upper substrate 112 and lower substrate 111.

Cooling unit 15 is disposed below lower substrate 111. Cooling unit 15 is implemented by, e.g. a Peltier element. Cooling unit 15 is preferably disposed directly under adsorbent 14, i.e., opposite to adsorbent 14 across material layer 17 and inner wall 111A.

The method described above provides chemical substance concentrator 20 according to the embodiment.

However, material layer 17 may not necessarily function as the seed layer for forming adsorbent 14. For example, in a case where such a seed layer is not required to grow adsorbent 14, material layer 17 may be a part of the layer of adsorbent 14 formed on inner wall 111A during the process for forming adsorbent 14. Specifically, adjacent ones of nanowires 141 that configure adsorbent 14 are joined to each other at root portions of nanowires 141 which are located toward inner wall 111A. Material layer 17 may be implemented by a layer formed by joining nanowires 141 together. Material layer 17 is disposed on inner wall 111A and between electrodes 12 and 13.

Adsorbent 14 and material layer 17 may be either a part of the configuration formed as a single-piece body, or the respective configurations that are formed as separate bodies. In chemical substance concentrator 20, an electric current flows between electrodes 12 and 13 via electrode wiring 25. Material layer 17 is formed on an upper surface of electrode wiring 25. Material layer 17 includes end portions 171 and 172. End portion 171 is sandwiched between electrodes 12 and 18. Portion 172 is sandwiched between electrodes 13 and 19.

Figure 4:
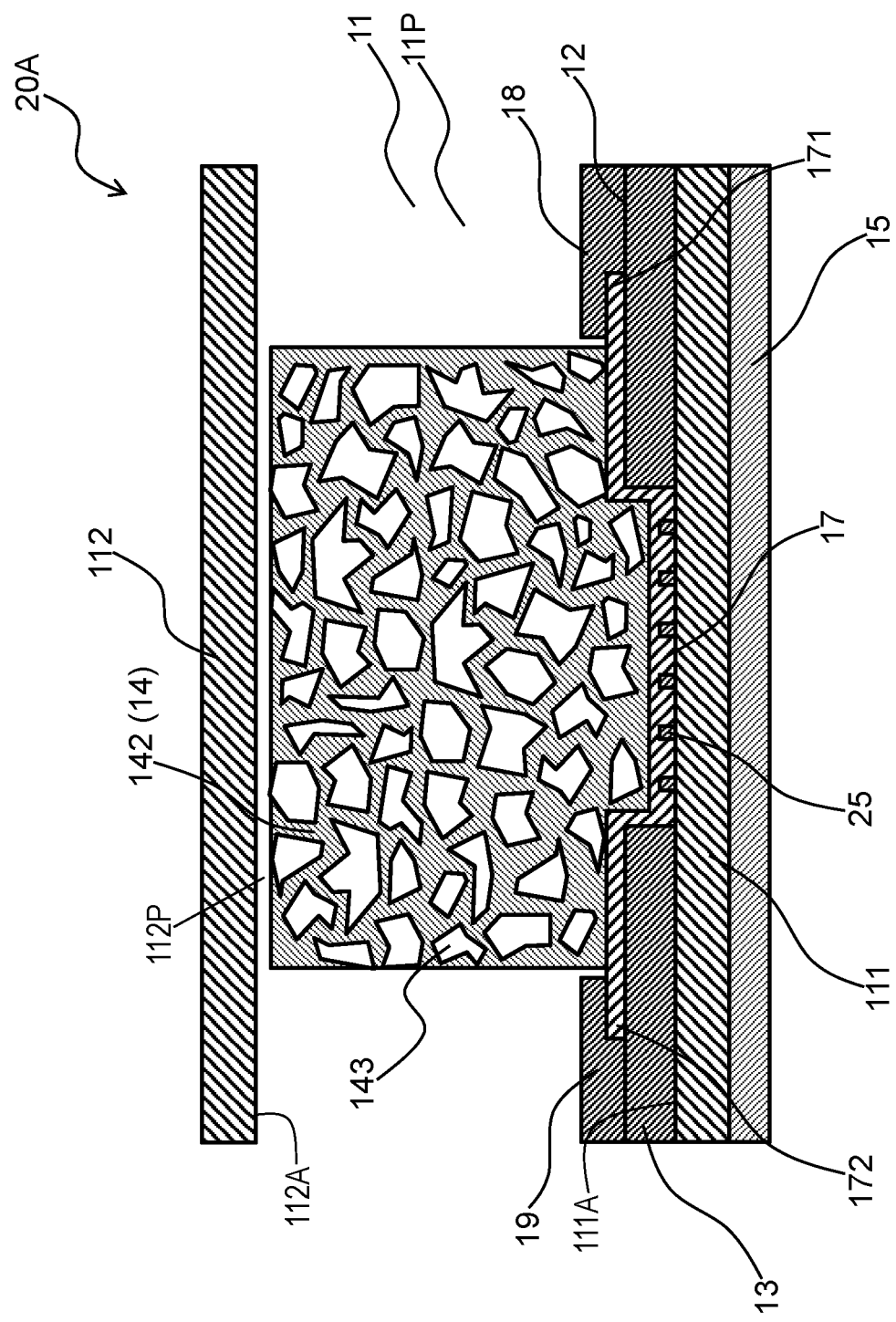
FIG. 4 is a cross-sectional view of another chemical substance concentrator according to the embodiment.

FIG. 4 is a cross-sectional view of another chemical substance concentrator 20A according to the embodiment. In FIG. 4, components identical to those of chemical substance concentrator 20 shown in FIG. 3 are denoted by the same reference numerals. Chemical substance concentrator 20A includes adsorbent 142 instead of adsorbent 14 of chemical substance concentrator 20 shown in FIG. 3. Adsorbent 14 of chemical substance concentrator 20 shown in FIG. 3 is implemented by nanowires 141. Adsorbent 142 of chemical substance concentrator 20A shown in FIG. 4 is a porous body containing spaces (pores) 143 allowing gaseous sample 90 to pass through spaces 143. Adsorbent 142 is made of, e.g. the same material as nanowires 141, that is, a metal oxide, having electrical conductivity. Adsorbent 142 made of the porous body has a large number of spaces (pores) 143 disposed randomly. Therefore, adsorbent 142 contains a lot of transmission paths through which the heat transmits, accordingly decreasing local unevenness in temperature of adsorbent 142 upon being heated.

Adsorbent 142 made of the porous body may include a porous body made of carbon or resin and a coating that covers the surface of the porous body. The coating is made of, e.g. metal oxide having high thermal conductivity. This configuration enhances the thermal conduction along surface of the porous body on which chemical substances 92 have been adsorbed, and allows chemical substances 92 having been adsorbed on adsorbent 142 to be efficiently desorbed from adsorbent 142.

Figure 5A:
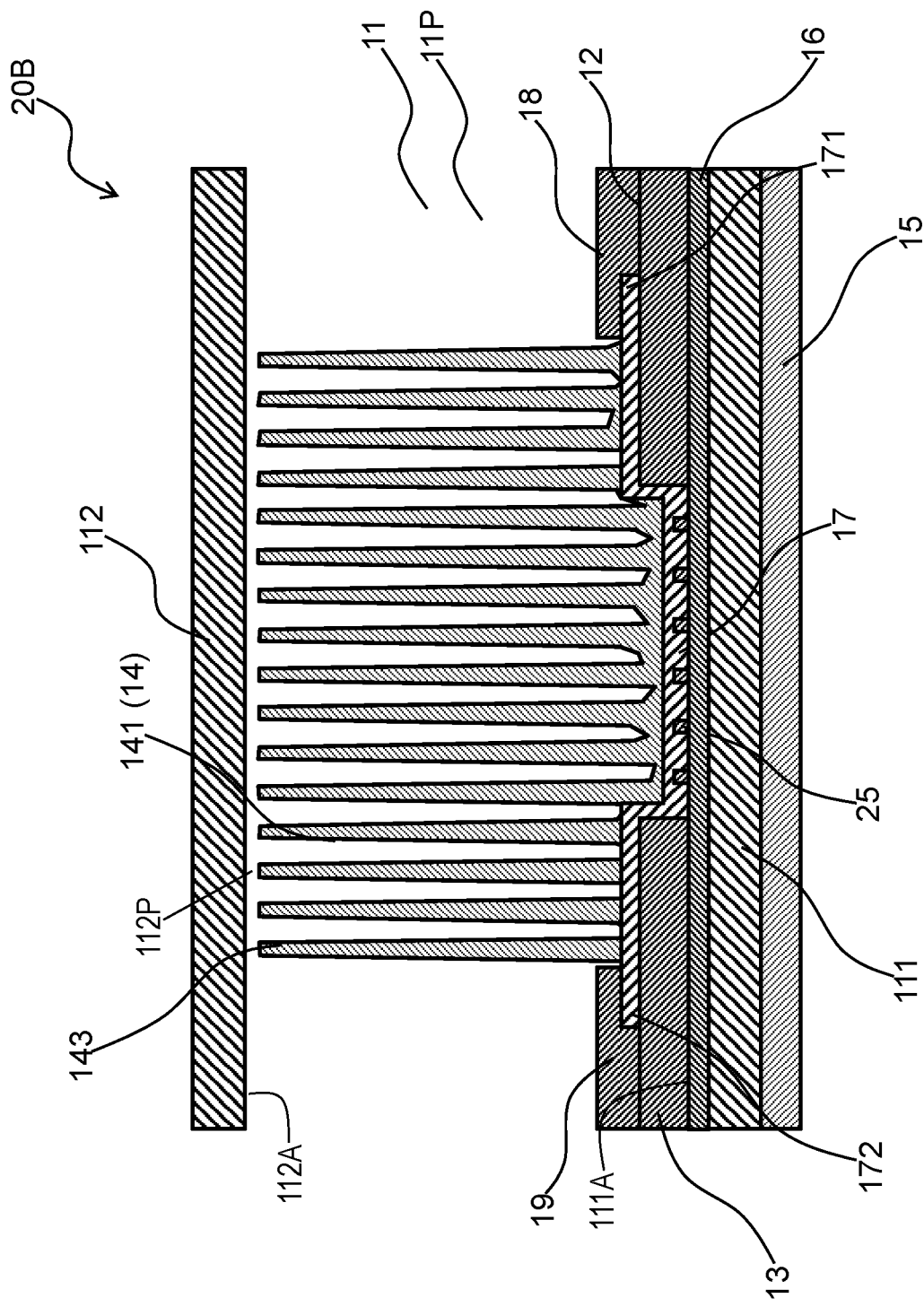
FIG. 5A is a cross-sectional view of still another chemical substance concentrator according to the embodiment.

FIG. 5A is a cross-sectional view of still another chemical substance concentrator 20B according to the embodiment. In FIG. 5A, components identical to those of chemical substance concentrator 20 shown in FIG. 3 are denoted by the same reference numerals. Chemical substance concentrator 20B includes thermal insulating layer 16 disposed between material layer 17 and inner wall 111A of flow passage 11. Thermal insulating layer 16 prevents the heat generated by adsorbent 14 and material layer 17 from being adversely transmitted through lower substrate 111 to the outside. Thermal insulating layer 16 may be made of resin material, such as epoxy, polyimide, polyethylene terephthalate, polystyrene, or polycarbonate. Alternatively, thermal insulating layer 16 may be made of material, such as metal oxide, such as $ZrO_2$ or $Al_2TiO_5$, glass material, or porous material, such as silica aerogel or expandable polymer.

In chemical substance concentrators 20, 20A, and 20B, clearance 112P is provided between adsorbent 14 and upper substrate 112. Clearance 112P between adsorbent 14 and upper substrate 112 prevents the heat transmitted through electrode wiring 25 to adsorbent 14 from being adversely transmitted to upper substrate 112.

Figure 5B:
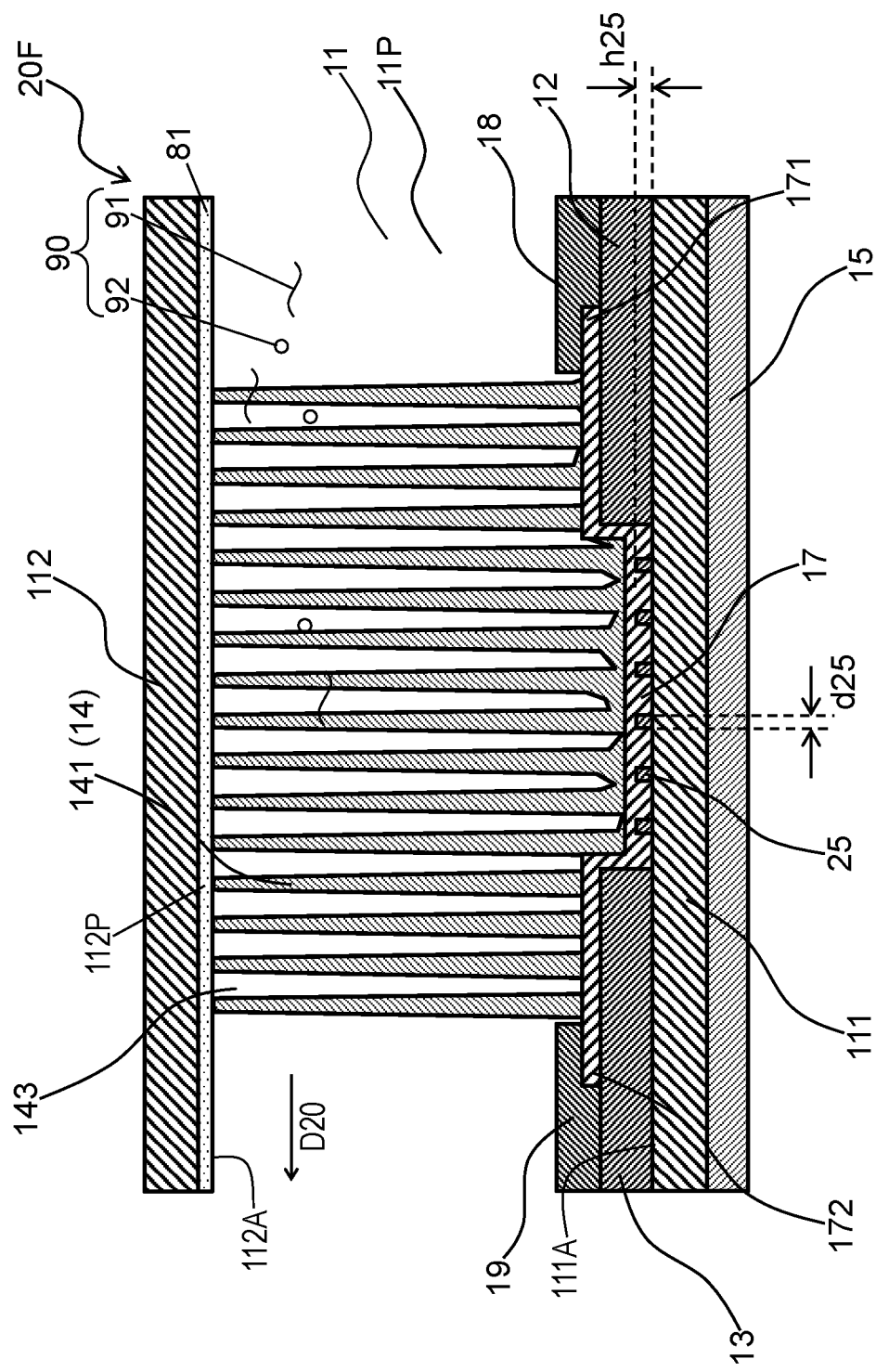
FIG. 5B is a cross-sectional view of a further chemical substance concentrator according to the embodiment.

FIG. 5B is a cross-sectional view of further chemical substance concentrator 20F according to the embodiment. In FIG. 5B, components identical to those of chemical substance concentrator 20 shown in FIG. 3 are denoted by the same reference numerals. Upper substrate 112 includes thermal insulating layer 81 disposed on inner wall 112A. Adsorbent 14 is contacts thermal insulating layer 81 disposed on inner wall 112A of upper substrate 112. Although adsorbent 14 contacts upper substrate 112, this configuration prevents the heat transmitted through electrode wiring 25 to adsorbent 14 from being adversely transmitted to upper substrate 112.

Figure 5C:
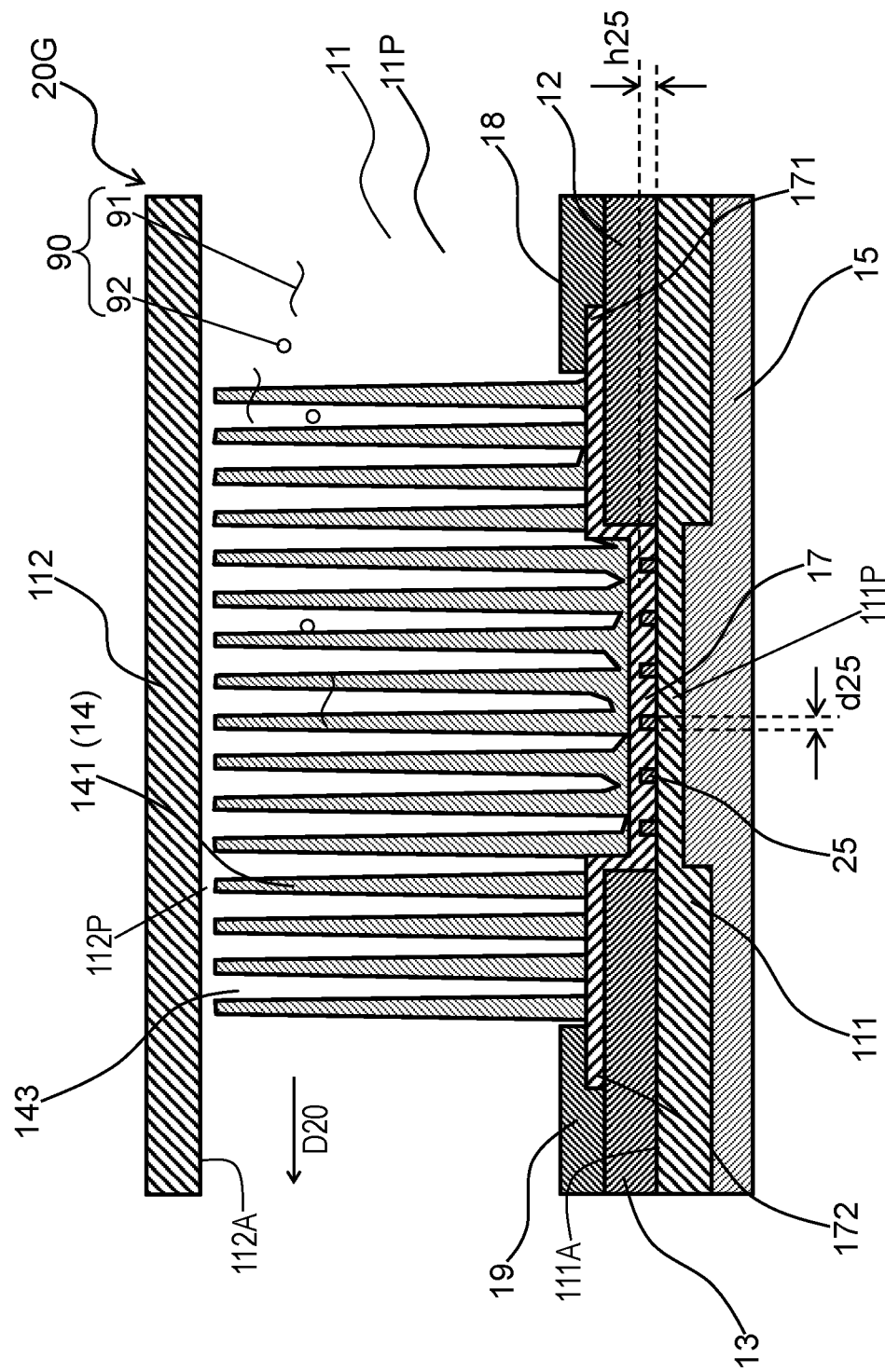
FIG. 5C is a cross-sectional view of a further chemical substance concentrator according to the embodiment.

FIG. 5C is a cross-sectional view of further chemical substance concentrator 20G according to the embodiment. In FIG. 5C, components identical to those of chemical substance concentrator 20 shown in FIG. 3 are denoted by the same reference numerals.

In chemical substance concentrator 20G, part 111P of lower substrate 111 at inner wall 111A on which material layer 17 is disposed is locally thin. This configuration reduces the thermal capacity of part 111P of lower substrate 111 at inner wall 111A, and allows an efficient and rapid heating of adsorbent 14.

Figure 5D:
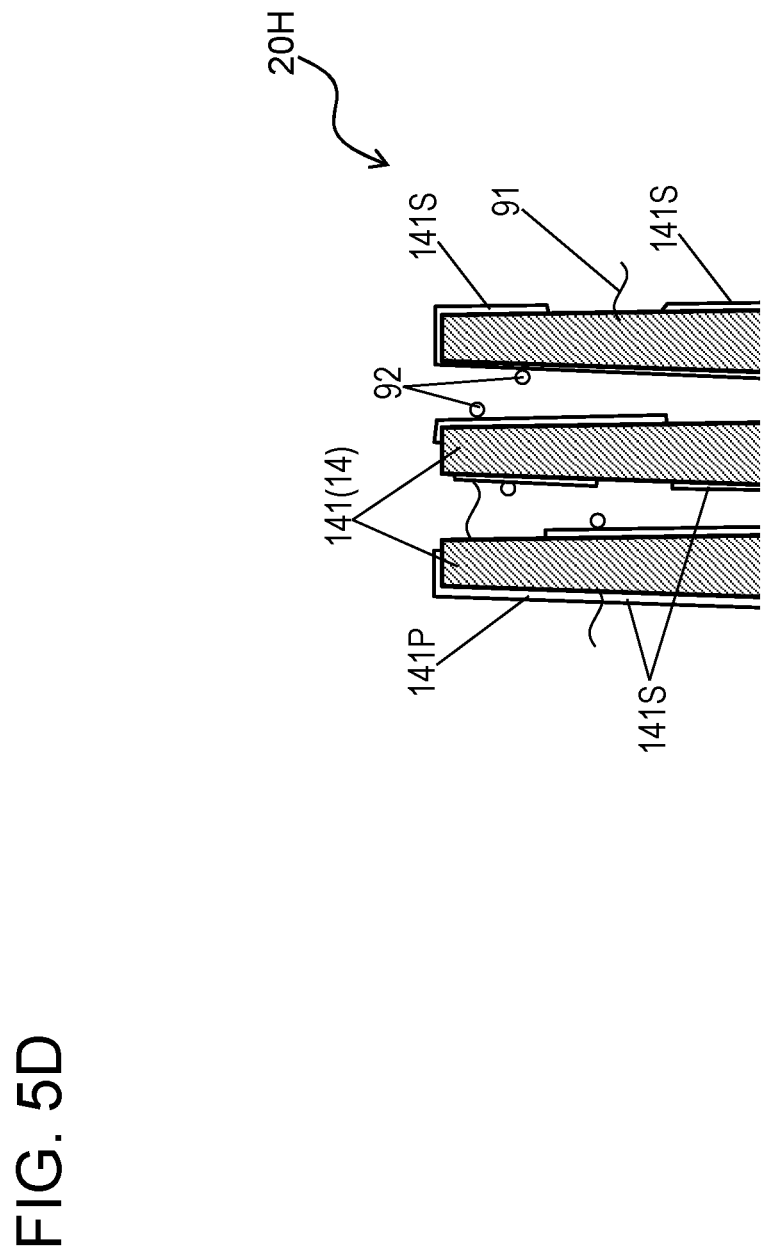
FIG. 5D is an enlarged cross-sectional view of a further chemical substance concentrator according to the embodiment.

FIG. 5D is an enlarged cross-sectional view of further chemical substance concentrator 20H according to the embodiment. In FIG. 5D, components identical to those of chemical substance concentrator 20 shown in FIG. 3 are denoted by the same reference numerals. FIG. 5D enlarges adsorbent 14 to illustrate nanowires 141.

In chemical substance concentrator 20H shown in FIG. 5D, the surface of each of nanowires 141 of adsorbent 14 is coated with surface coating 141S. Nanowire 141 is partially coated with surface coating 141S. The material of surface coating 141S is determined depending on chemical substances 92 to be adsorbed by adsorbent 14. Adsorbent 14 of chemical substance concentrator 20H adsorbs chemical substances 92 specified in accordance with the material of surface coating 141S.

Figure 6:
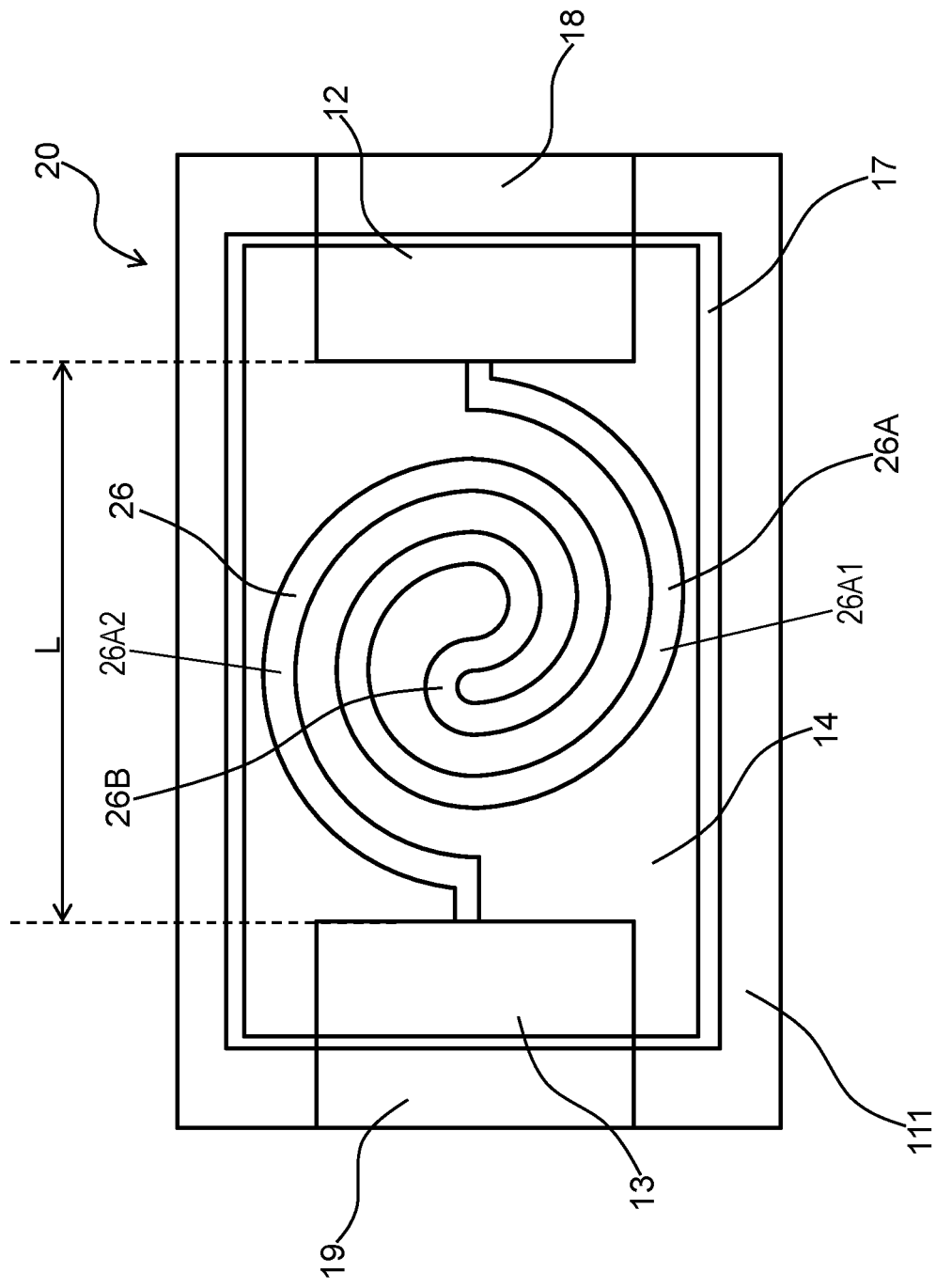
FIG. 6 is a top perspective view of another electrode wiring of the chemical substance concentrator according to the embodiment.

FIG. 6 is a schematic top-perspective view of another electrode wiring 26 of chemical substance concentrator 20 (20A, 20B, 20F) according to the embodiment. Electrode wiring 26 is made of the same material as electrode wiring 25 and has the same function as electrode wiring 25.

Electrode wiring 26 includes curved sections 26A1 and 26A2, and turn-back section 26B. Curved sections 26A1 and 26A2 are configured with, for example, plural wiring patterns having semicircular arcuate shapes connected to each other, and are connected to electrodes 12 and 13, respectively. Curved section 26A1 connected to electrode 12 is turned back, via turn-back section 26B, and is connected to curved section 26A2. Curved section 26A2 is connected to electrode 13. Thus, the length of electrode wiring 26 is larger than distance L between electrode 12 and electrode 13. This configuration allows electrode wiring 26 to efficiently generate heat, thereby efficiently heating adsorbent 14.

Figure 7:
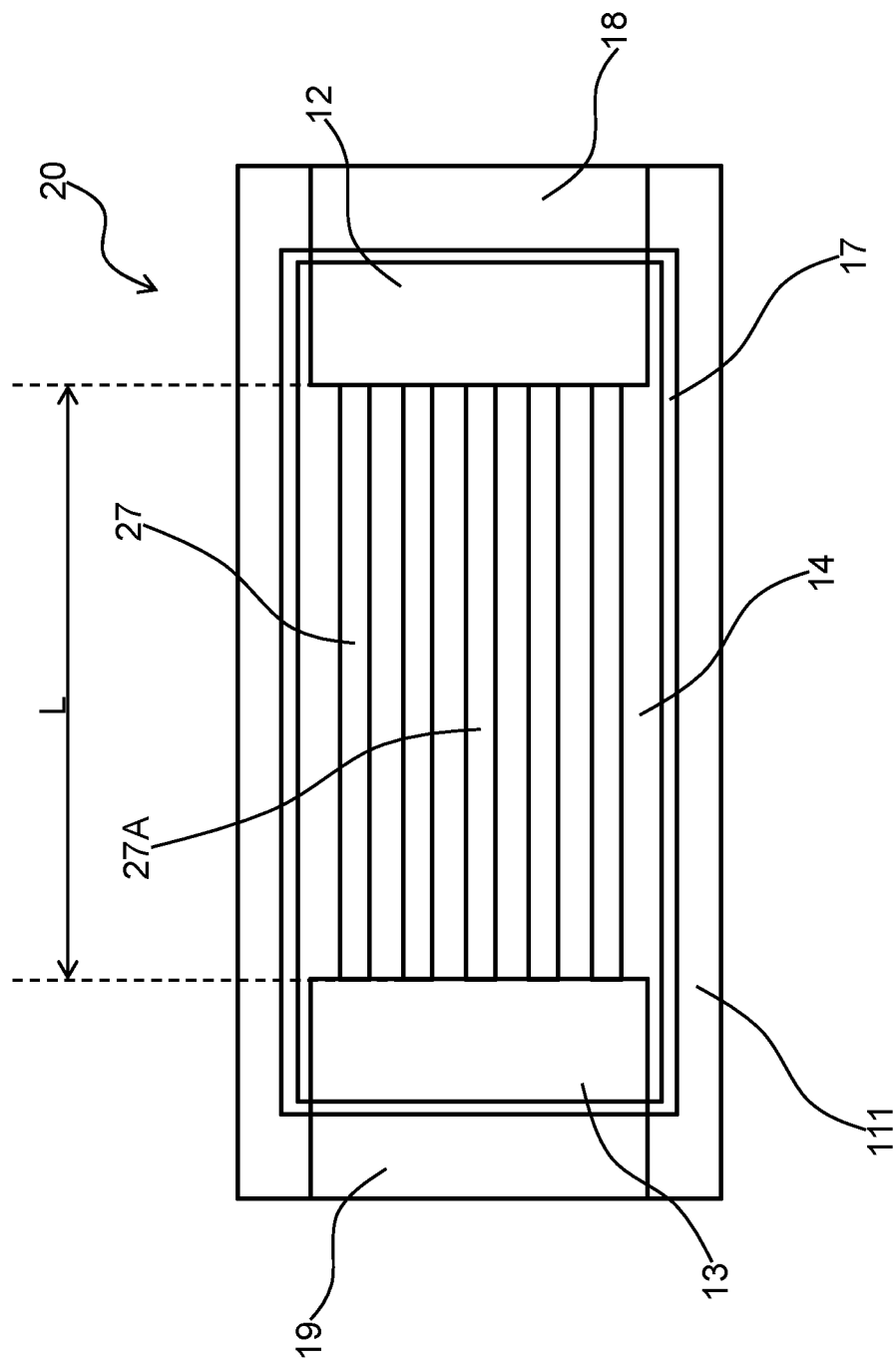
FIG. 7 is a top perspective view of still another electrode wiring of the chemical substance concentrator according to the embodiment.

FIG. 7 is a schematic top-perspective view of still another electrode wiring 27 according to the embodiment.

Electrode wiring 27 is configured with plural straight sections 27A that connects electrode 12 to electrode 13. Straight sections 27A are connected to electrode 12 and 13 in parallel between electrodes 12 and 13. For this reason, a total electrical resistance of straight sections 27A is small. On the other hand, straight sections 27A increases a region in which material layer 17 can be heated. Electrode wiring 27 will be described below while comparing it with another device in which the region is heated by a heater configured with a single sheet of an electrode film. Electrode wiring 27 configured with plural straight sections 27A has a larger electrical resistance than the heater configured with the single sheet of the electrode film. Therefore, electrode wiring 27 efficiently heats the region of material layer 17 on which adsorbent 14 is formed.

Electrode wiring 27 may be configured with only single straight section 27A. In this case, the length of the electrode wiring is the same as distance L between electrodes 12 and 13. Provided that the widths of the straight sections are the same, electrode wiring 27 configured with only single straight section 27A has a larger electrical resistance than electrode wiring 27 configured with plural straight sections 27A. For this reason, electrode wiring 27 configured with only single straight section 27A has larger heat generation efficiency than electrode wiring 27 configured with plural straight sections 27A. The heat generated by electrode wiring 27 is directly transmitted to adsorbent 14 via material layer 17. For this reason, in a case where chemical substances 92 having been adsorbed on adsorbent 14 disposed in a narrow region are to be desorbed, for example, in a case where a small amount of chemical substances 92 is to be desorbed from adsorbent 14, this configuration is capable of efficiently desorbing chemical substance 92.

Figure 8:
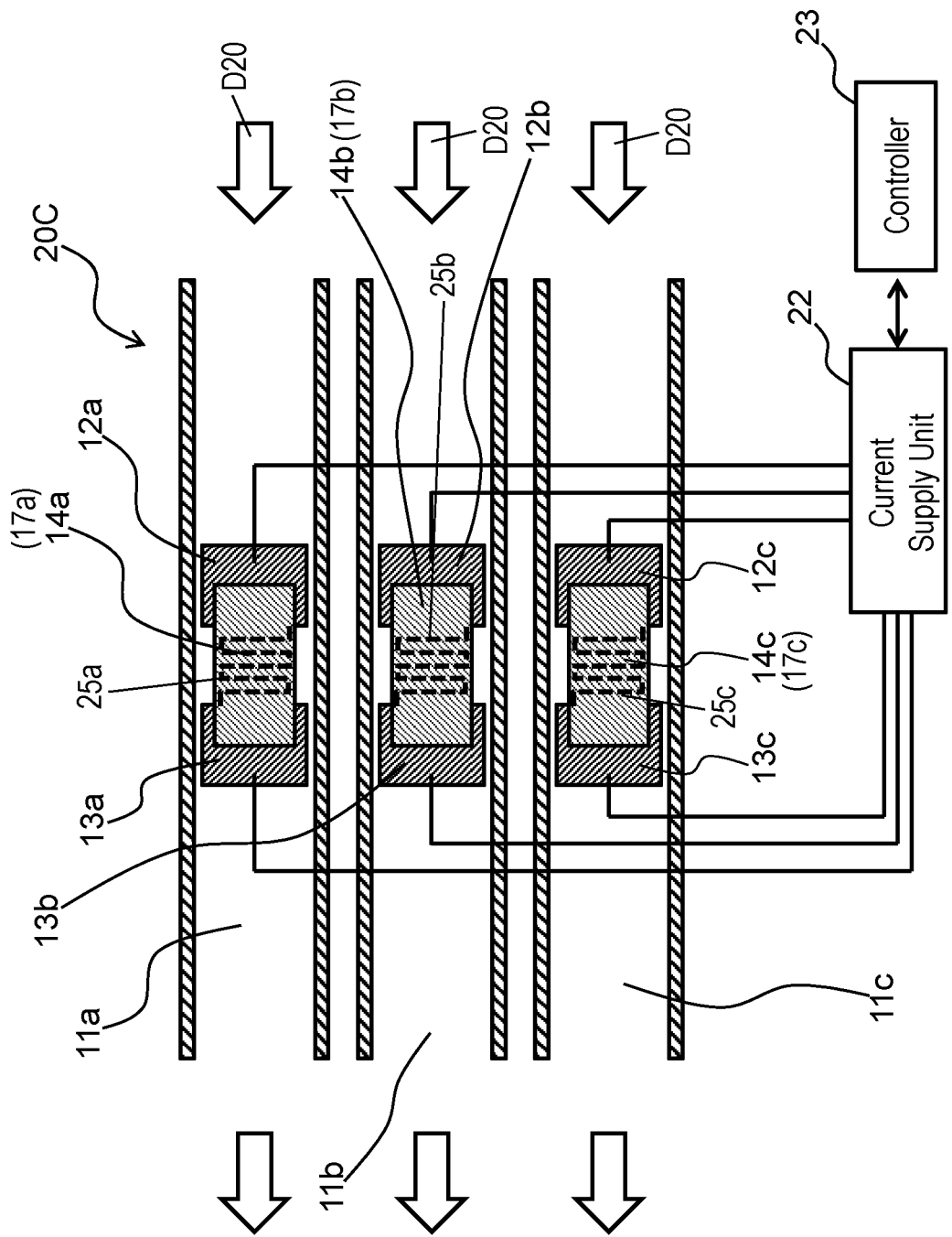
FIG. 8 is a top view of the chemical substance concentrator according to the embodiment for illustrating an arrangement of adsorbents of the chemical substance concentrator.

FIG. 8 is a schematic view of further chemical substance concentrator 20C according to the embodiment. In FIG. 8, components identical to those of chemical substance concentrator 20 shown in FIG. 1 are denoted by the same reference numerals.

Chemical substance concentrator 20C includes plural flow passages 11a, 11b, and 11c each of which has the same structure as flow passage 11 shown in FIG. 1. Adsorbents 14a, 14b, and 14c are disposed inside flow passages 11a, 11b, and 11c, respectively. Adsorbent 14a is disposed on material layer 17a formed on electrode wiring 25a which is connected to electrodes 12a and 13a. Adsorbent 14b is disposed on material layer 17b formed on electrode wiring 25b which is connected to electrodes 12b and 13b. Adsorbent 14c is disposed on material layer 17c formed on electrode wiring 25c which is connected to electrodes 12c and 13c. Electrodes 12a to 12c are made of the same material as electrode 12 shown in FIG. 1 and have the same structure as electrode 12. Electrodes 13a to 13c are made of the same material as electrode 13 shown in FIG. 1 and have the same structure and function as electrode 13. Electrode wirings 25a to 25c are made of the same material as electrode wiring 25 shown in FIG. 1 and have the same structure and function as electrode wiring 25. Material layers 17a to 17c are made of the same material as material layer 17 shown in FIG. 1 and have the same structure and function as material layer 17. Adsorbents 14a and 14c are made of the same material as adsorbent 14 shown in FIG. 1 and have the same structure and function as adsorbent 14.

Figure 9:
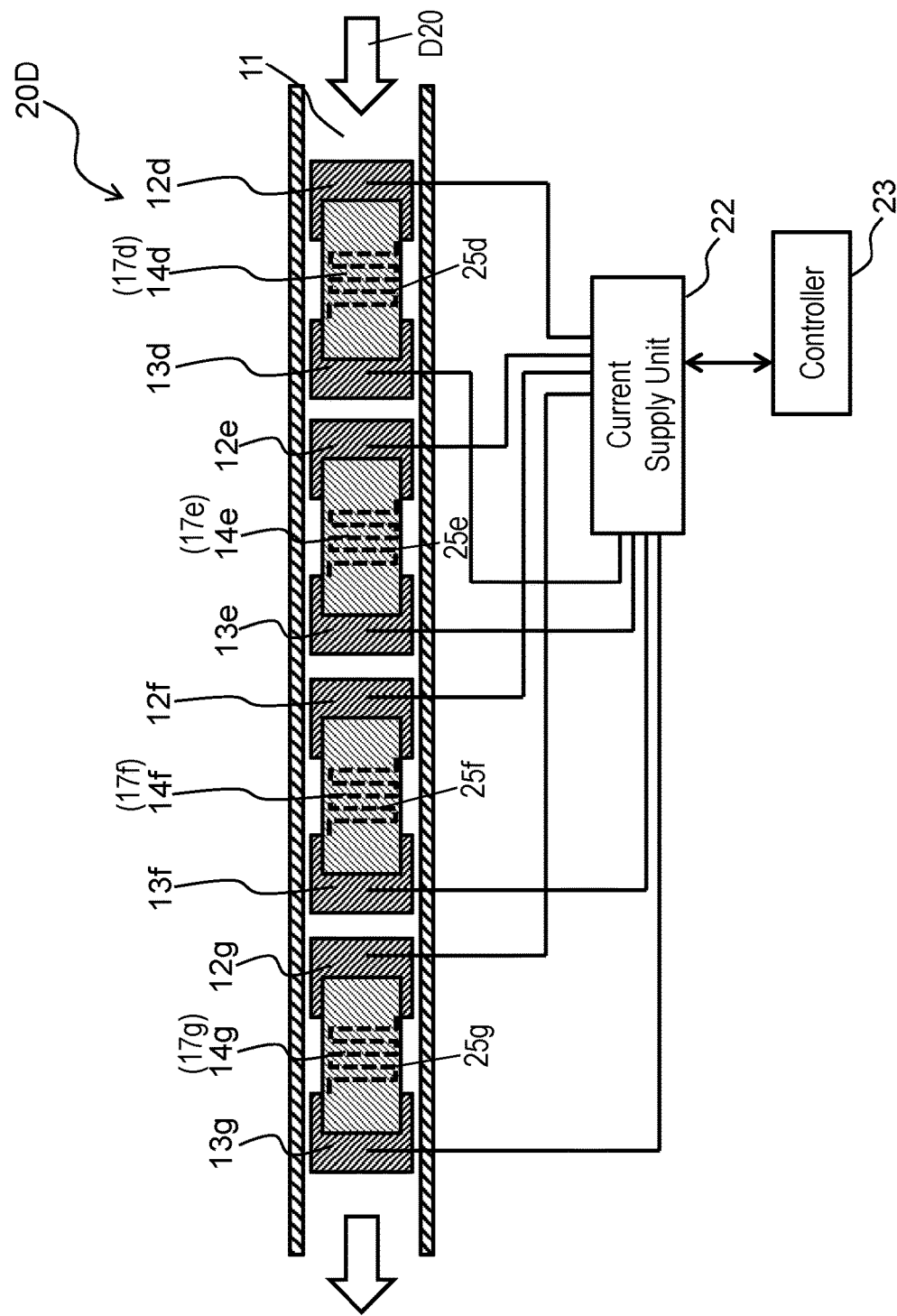
FIG. 9 is a top view of the chemical substance concentrator according to the embodiment for illustrating another arrangement of the adsorbents of the chemical substance concentrator.

FIG. 9 is a schematic view of further chemical substance concentrator 20D according to the embodiment. In FIG. 9, components identical to those of chemical substance concentrator 20 shown in FIG. 1 are denoted by the same reference numerals.

Chemical substance concentrator 20D includes plural adsorbents 14d, 14e, 14f, and 14g. Adsorbent 14d is disposed on material layer 17d formed on electrode wiring 25d which is connected to electrodes 12d and 13d. Adsorbent 14e is disposed on material layer 17e formed on electrode wiring 25e which is connected to electrodes 12e and 13e. Adsorbent 14f is disposed on material layer 17f formed on electrode wiring 25f which is connected to electrodes 12f and 13f Adsorbent 14g is disposed on material layer 17g formed on electrode wiring 25g which is connected to electrodes 12g and 13g. Electrodes 12d to 12g are made of the same material as electrode 12 shown in FIG. 1 and have the same structure as electrode 12. Electrodes 13d to 13g are made of the same material as electrode 13 shown in FIG. 1 and have the same structure and function as electrode 13. Electrode wirings 25d to 25g are made of the same material as electrode wiring 25 shown in FIG. 1 and have the same structure and function as electrode wiring 25. Material layers 17d to 17g are made of the same material as material layer 17 shown in FIG. 1 and have the same structure and function as material layer 17. Adsorbents 14d to 14g are made of the same material as adsorbent 14 shown in FIG. 1 and have the same structure and function as adsorbent 14.

That is, adsorbents 14d to 14g are disposed separately from each other inside one flow passage 11. Adsorbents 14d to 14g are arranged in direction D20 in which gaseous sample 90 flows.

Figure 10:
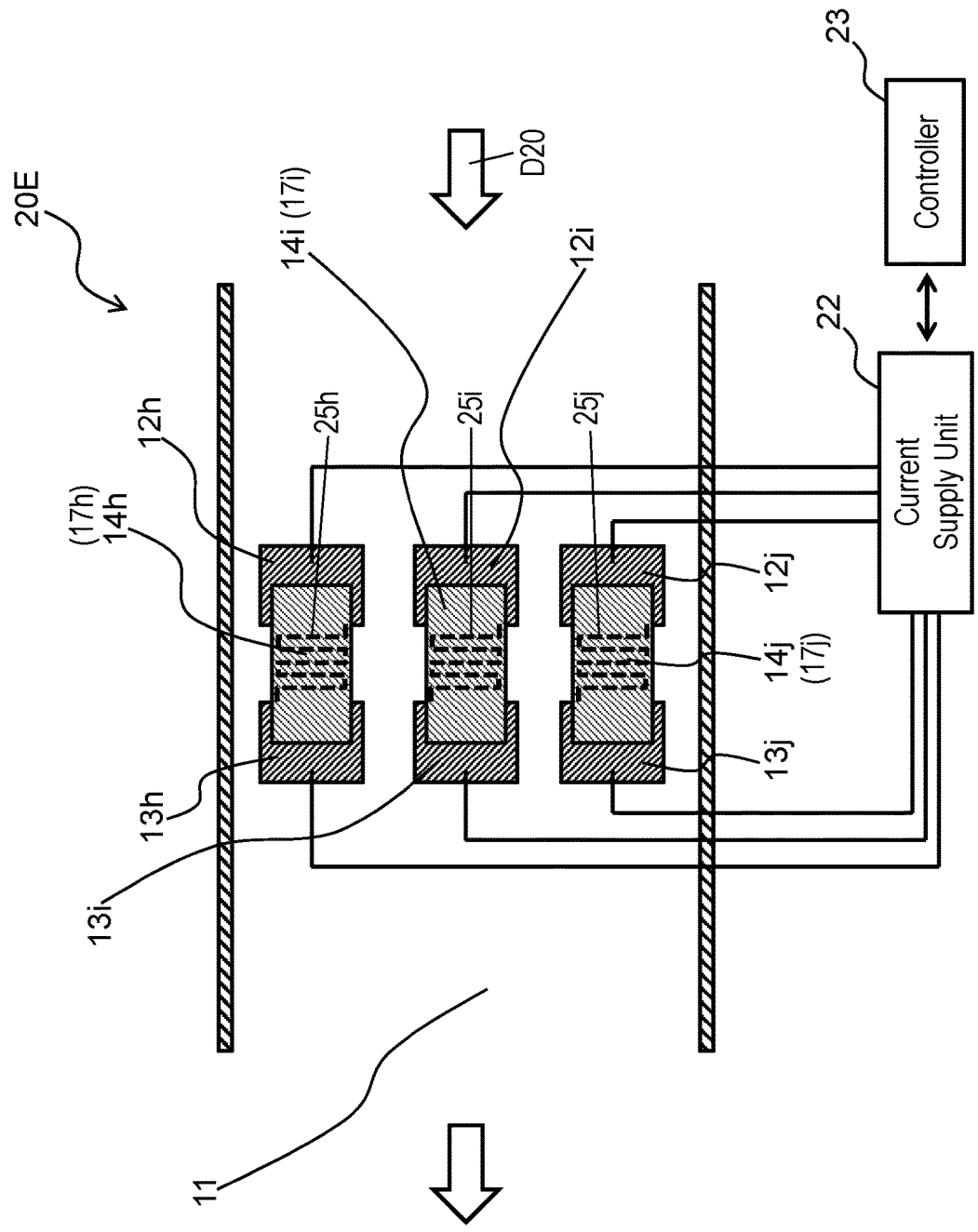
FIG. 10 is a top view of the chemical substance concentrator according to the embodiment for illustrating still another arrangement of the adsorbents of the chemical substance concentrator.

FIG. 10 is a schematic view of further chemical substance concentrator 20E according to the embodiment. In FIG. 10, components identical to those of chemical substance concentrator 20 shown in FIG. 1 are denoted by the same reference numerals.

Chemical substance concentrator 20E includes plural adsorbents 14h, 14i, and 14j. Adsorbent 14h is disposed on material layer 17h formed on electrode wiring 25h which is connected to electrodes 12h and 13h. Adsorbent 14i is disposed on material layer 17i formed on electrode wiring 25i which is connected to electrodes 12i and 13i. Adsorbent 14j is disposed on material layer 17j formed on electrode wiring 25j which is connected to electrodes 12j and 13j. Electrodes 12h to 12j are made of the same material as electrode 12 shown in FIG. 1 and have the same structure as electrode 12. Electrodes 13h to 13j are made of the same material as electrode 13 shown in FIG. 1 and have the same structure and function as electrode 13. Electrode wirings 25h to 25j are made of the same material as electrode wiring 25 shown in FIG. 1 and have the same structure and function as electrode wiring 25. Material layers 17h to 17j are made of the same material as material layer 17 shown in FIG. 1 and have the same structure and function as material layer 17. Adsorbents 14h to 14j are made of the same material as adsorbent 14 shown in FIG. 1 and have the same structure and function as adsorbent 14.

That is, adsorbents 14h to 14j are disposed separately from each other inside one flow passage 11. Adsorbents 14h to 14j are arranged in a direction perpendicular to direction D20 in which gaseous sample 90 flows.

Electrodes 12a to 12j and 13a to 13j which are connected to electrode wirings 25a to 25j disposed under adsorbents 14a to 14j, respectively, are electrically connected to current supply unit 22. Current supply unit 22 is able to supply an electric current selectively to electrodes 12a to 12j and 13a to 13j that are connected to electrode wirings 25a to 25j, respectively.

In chemical substance concentrator 20D shown in FIG. 9, plural adsorbents 14d to 14j are disposed inside one flow passage 11 separately from each other. In this case, plural adsorbents 14d to 14g may be made of different materials. Alternatively, plural adsorbents 14d to 14 may be made of different nanowires having different surface coatings 141S (see FIG. 5D) made of materials different from each other provided at respective surfaces of the absorbents. This configuration allows plural adsorbents 14d to 14g to be able to adsorb respective chemical substances 92 different from each other. Therefore, chemical substance concentrator 20D is capable of selectively adsorbing and concentrating chemical substances 92 that are contained in gaseous sample 90.

In chemical substance concentrator 20E shown in FIG. 10, plural adsorbents 14h to 14j are disposed inside one flow passage 11 separately from each other. In this case, plural adsorbents 14h to 14j may be made of different materials. Alternatively, plural adsorbents 14h to 14j may be made of respective different nanowires having surfaces on which different surface coatings 141S (see FIG. 5D) made of materials different from each other provided at respective surfaces of the absorbents. This configuration allows plural adsorbents 14h to 14j to be able to adsorb respective chemical substances 92 different from each other. Therefore, chemical substance concentrator 20E is capable of selectively adsorbing and concentrating chemical substances 92 that are contained in gaseous sample 90.

Chemical substance 92 tends to be adsorbed by a substance having the same polarity as the chemical substance. Accordingly, chemical substances 92 of highly-polarized molecules tend to be adsorbed by adsorbent 14 having a highly-polarized surface. Chemical substance 92 of non-polarized molecules tend to be adsorbed by adsorbent 14 having a non-polarized surface. Adsorbent 14 thus exhibits different degree of absorbing chemical substances 92 depending on the material of the adsorbent.

The properties of adsorbents 14 may be changed in materials or surface coatings 141S so as to allow chemical substance concentrator 20C to be able to selectively and separately adsorb different chemical substances 92 onto different adsorbents 14a to 14c. This configuration allows chemical substance concentrator 20D to be able to selectively and separately adsorb different chemical substances 92 onto respective different adsorbents 14d to 14g. This configuration allows chemical substance concentrator 20E to able to selectively and separately adsorb different chemical substances 92 onto respective different adsorbents 14h to 14j.

In chemical substance concentrator 20C including plural adsorbents 14a to 14c disposed separately from each other, current supply unit 22 for supplying an electric current to electrode wiring 25 may selectively supply the current to electrodes 12a to 12c and 13a to 13c that are connected to electrode wirings 25a to 25c disposed below adsorbents 14a to 14c, respectively. Similarly, in chemical substance concentrator 20D, current supply unit 22 may selectively supply an electric current to electrodes 12d to 12g and 13d to 13g that are connected to electrode wirings 25d to 25g disposed below adsorbents 14d to 14g, respectively. Similarly, in chemical substance concentrator 20E, current supply unit 22 may selectively supply the current to electrodes 12h to 12j and 13h to 13j that are connected to electrode wirings 25h to 25j disposed under adsorbents 14h to 14j, respectively.

This configuration allows the timings at which chemical substances 92 adsorbed on respective adsorbents 14a to 14c, 14d to 14g, and 14h to 14j are desorbed from the respective absorbents to be controlled independently. Therefore, chemical substance concentrators 20C to 20E are capable of desorbing only to-be-detected chemical substance 92 from corresponding adsorbents 14a to 14c, 14d to 14g, or 14h to 14j, and sending the desorbed substance to detection unit 21.

Electrodes 12a to 12c, 12d to 12g, and 12h to 12j which are connected to electrode wirings 25a to 25c, 25d to 25g, and 25h to 25j disposed below plural adsorbents 14a to 14c, 14d to 14g, and 14h to 14j, respectively, are not necessarily separate electrodes. Similarly, electrodes 13a to 13c, 13d to 13g, and 13h to 13j which are connected in the same manner as described above, are not necessarily separate electrodes. For example, one electrode 12 and one electrode 13 may be disposed such that each of them is divided into plural electrodes that are connected to respective electrode wirings. These respective electrode wirings are electrode wirings 25a to 25c, 25d to 25g, or 25h to 25j that are disposed under plural adsorbents 14a to 14c, 14d to 14g, and 14h to 14j, respectively.

Figure 11:
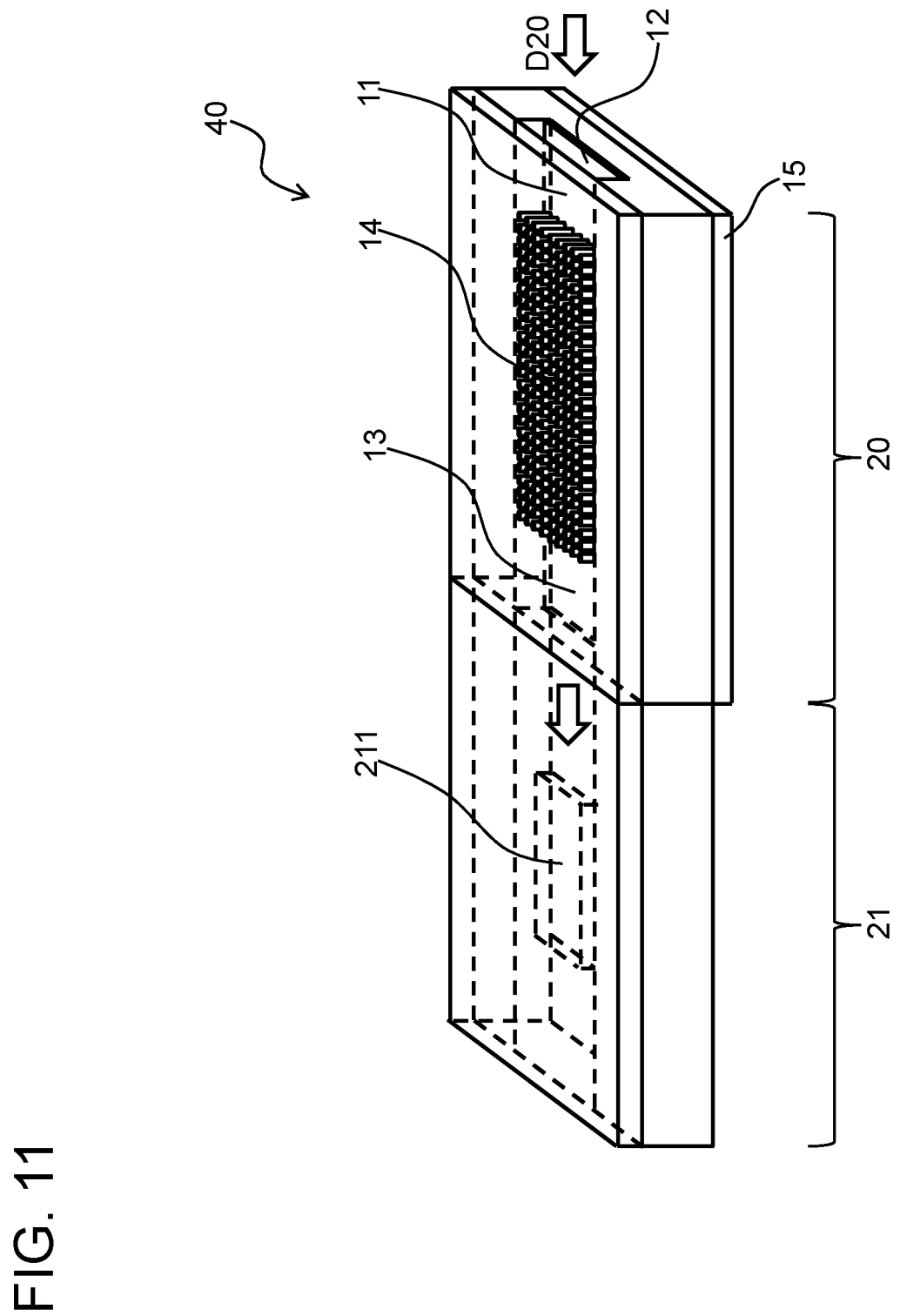
FIG. 11 is a perspective view of a chemical substance detection device according to the embodiment.

FIG. 11 is a schematic top-perspective view of chemical substance detection device 40 according to an embodiment. Gaseous sample 90 flows in direction D20.

Chemical substance detection device 40 includes detection unit 21 that is disposed in a subsequent stage to, i.e. on the downstream side of, chemical substance concentrator 20. Detection unit 21 includes detection element 211 disposed in flow passage 11.

Detection element 211 may be a semiconductor sensor, an electrochemical sensor, a biosensor including a surface acoustic wave element or field-effect transistor, or an optical sensor.

In chemical substance detection device 40, chemical substance concentrator 20 concentrates chemical substances 92 contained in gaseous sample 90, and detection unit 21 detects thus-concentrated chemical substances 92. Therefore, chemical substance detection device 40 is capable of detecting chemical substances 92 sensitively.

As described above, although the chemical substance concentrators and chemical substance detection device according to one or more aspects have been described in accordance with the exemplary embodiments, the present disclosure is not limited to the exemplary embodiments. Other forms in which various modifications apparent to those skilled in the art are applied to the exemplary embodiments, or forms structured by combining structural elements of different exemplary embodiments may be included within the scope of the one or more aspects, unless such modifications and combinations depart from the scope of the present disclosure.

INDUSTRIAL APPLICABILITY

A chemical substance concentrator according to the present disclosure is useful for a small chemical sensor that can detect, e.g. volatile organic compounds in an ambient environment.

REFERENCE MARKS IN THE DRAWINGS 11 flow passage
111 lower substrate
111A inner wall
112 upper substrate
12, 12a-12i electrode (first electrode, third electrode)
13, 13a-13i electrode (second electrode, fourth electrode)
14, 14a-14i adsorbent
141 nanowire
142 adsorbent
143 space
15 cooling unit
16 thermal insulating layer
17, 17a-17i material layer
18 electrode (third electrode)
19 electrode (fourth electrode)
20, 20A, 20B, 20C, 20D, 20E chemical substance concentrator
21 detection unit
211 detection element
22 current supply unit
23 controller
25, 25a-25i, 26, 27 electrode wiring
40 chemical substance detection device
90 gaseous sample
92 chemical substance

The invention claimed is:

1. A chemical substance concentrator configured to concentrate a chemical substance contained in a gaseous sample, the concentrator comprising:
a flow passage having a hollow part allowing the gaseous sample flows through the hollow part, the flow passage having a first inner wall facing the hollow part;
a first electrode disposed on the first inner wall of the flow passage;
a second electrode disposed on the first inner wall and located away from the first electrode;
a first electrode wiring connected to the first electrode and to the second electrode, the first electrode wiring generating heat upon being energized;
a first material layer disposed on the first electrode wiring so as to transmit the generated heat;
a first adsorbent disposed on the first material layer, the first adsorbent configured to adsorb the chemical substance and to desorb, by the transmitted heat; the adsorbed chemical substance;
a third electrode disposed on the first material layer; and
a fourth electrode disposed on the first material layer,
wherein the first material layer extends to the first electrode and the second electrode; and
wherein the first material layer is sandwiched between the first electrode and the third electrode, and is sandwiched between the second electrode and the fourth electrode.

2. The chemical substance concentrator of claim 1, wherein the first adsorbent is made of conductive nanowires.

3. The chemical substance concentrator of claim 2, wherein the nanowires contain metal oxide, and the first material layer contains the metal oxide.

4. The chemical substance concentrator of claim 2, wherein each of the nanowires includes a metal oxide and a carbon nanotube covered with the metal oxide.

5. The chemical substance concentrator of claim 1, wherein the first adsorbent is made of a conductive porous body.

6. The chemical substance concentrator of claim 1, wherein the first material layer has:
a first surface having the first electrode and the second electrode disposed thereon;
a second surface opposite to the first surface, the second surface having the third electrode and the fourth electrode disposed thereon;
a first side surface connected to the first surface and the second surface; and
a second side surface opposite to the first side surface, the second side surface being connected to the first surface and the second surface,
wherein the third electrode covering the first side surface of the first material layer and a part of the second surface of the first material layer, the third electrode contacting the first electrode, and wherein the fourth electrode covering the second side surface of the first material layer and a part of the second surface of the first material layer, the fourth electrode contacting the second electrode.

7. The chemical substance concentrator of claim 1, further comprising a cooling unit that cools the first adsorbent.

8. The chemical substance concentrator of claim 1, wherein the flow passage further has a second inner wall facing the hollow part, the a second inner wall facing the first inner wall across the hollow part.

9. A chemical substance detection device, comprising:
a chemical substance concentrator of claim 1; and
a detection unit that detects the chemical substance concentrated by the chemical substance concentrator.

10. A chemical substance concentrator configured to concentrate a chemical substance contained in a gaseous sample, the concentrator comprising:
a flow passage having a hollow part allowing the gaseous sample flows through the hollow part, the flow passage having a first inner wall facing the hollow part;
a first electrode disposed on the first inner wall of the flow passage;
a second electrode disposed on the first inner wall and located away from the first electrode;
a first electrode wiring connected to the first electrode and to the second electrode, the first electrode wiring generating heat upon being energized;
a first material layer disposed on the first electrode wiring so as to transmit the generated heat;
a first adsorbent disposed on the first material layer, the first adsorbent configured to adsorb the chemical substance and to desorb, by the transmitted heat, the adsorbed chemical substance;
a second material layer that transmits heat;
a second adsorbent disposed on the second material layer;
a third electrode disposed in the flow passage;
a fourth electrode disposed in the flow passage and located away from the third electrode;
a second electrode wiring connected to the third electrode and the fourth electrode, the second electrode wiring generating heat upon being energized; and
a current supply unit that selectively supplies an electric current to the first electrode, the second electrode, the third electrode, and the fourth electrode, wherein the second adsorbent is configured to adsorb the chemical substance and to desorb the chemical substance adsorbed by the second adsorbent from the second adsorbent by the heat transmitted by the second material layer, wherein the second material layer is disposed on the second electrode wiring so as to transmit the heat generated by the second electrode wiring, and wherein the second adsorbent is disposed on the second material layer, and is configured to adsorb the chemical substance and to desorb the chemical substance absorbed by the second adsorbent from the second adsorbent by the heat transmitted by the second material layer.

11. The chemical substance concentrator of claim 10, wherein the first adsorbent is made of conductive nanowires.

12. The chemical substance concentrator of claim 11, wherein the nanowires contain metal oxide, and the first material layer contains the metal oxide.

13. The chemical substance concentrator of claim 11, wherein each of the nanowires includes a metal oxide and a carbon nanotube covered with the metal oxide.

14. The chemical substance concentrator of claim 10, wherein the first adsorbent is made of a conductive porous body.

15. The chemical substance concentrator of claim 10, further comprising a cooling unit that cools the first adsorbent.

16. The chemical substance concentrator of claim 10, wherein the flow passage further has a second inner wall facing the hollow part, the a second inner wall facing the first inner wall across the hollow part.

17. The chemical substance concentrator of claim 10,
wherein the first adsorbent and the second absorbent are made of different materials, or
wherein the first absorbent and the second adsorbent include different surface coatings provided at respective surfaces of the first absorbent and the second adsorbent.

18. A chemical substance detection device, comprising:
a chemical substance concentrator of claim 10; and
a detection unit that detects the chemical substance concentrated by the chemical substance concentrator.

* * * * *